United States Patent
Yamada et al.

(10) Patent No.: US 6,658,734 B2
(45) Date of Patent: Dec. 9, 2003

(54) METHOD OF MANUFACTURING A CIRCUIT MEMBER FOR A RESIN-SEALED SEMICONDUCTOR DEVICE

(75) Inventors: Syuichi Yamada, Tokorozawa (JP); Makoto Nakamura, Kawagoe (JP); Takayuki Takeshita, Sakado (JP); Hiroshi Yagi, Urawa (JP)

(73) Assignee: Dai Nippon Insatsu Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/987,855

(22) Filed: Nov. 16, 2001

(65) Prior Publication Data

US 2002/0029894 A1 Mar. 14, 2002

Related U.S. Application Data

(62) Division of application No. 09/804,149, filed on Mar. 13, 2001, now Pat. No. 6,465,734, which is a division of application No. 09/123,558, filed on Jul. 29, 1998, now Pat. No. 6,359,221.

(30) Foreign Application Priority Data

Aug. 4, 1997 (JP) .............................................. 9-221208
Aug. 29, 1997 (JP) .............................................. 9-247480

(51) Int. Cl.⁷ ........................... H01R 43/00; H05K 3/10; H01K 3/22
(52) U.S. Cl. .............................. 29/854; 29/856; 29/846; 29/848; 257/666; 257/692
(58) Field of Search ........................ 29/841, 846, 847, 29/848, 849, 850, 854, 855, 856; 174/52.4; 257/666, 692, 778, 676, 737, 738; 438/106

(56) References Cited

U.S. PATENT DOCUMENTS

| | | | |
|---|---|---|---|
| 5,703,407 A | * 12/1997 | Hori .............................. | 257/666 |
| 6,002,167 A | * 12/1999 | Hatano et al. ............... | 257/666 |
| 6,025,640 A | *  2/2000 | Yagi et al. .................... | 257/666 |
| 6,060,768 A | *  5/2000 | Hayashida et al. .......... | 257/666 |
| 6,197,615 B1 | *  3/2001 | Song et al. .................. | 438/111 |
| 6,201,292 B1 | *  3/2001 | Yagi et al. ................... | 257/666 |

* cited by examiner

*Primary Examiner*—Carl J Arbes
*Assistant Examiner*—Thiem D Phan
(74) *Attorney, Agent, or Firm*—Oblon, Spivak, McClelland, Maier & Neustadt, P.C.

(57) ABSTRACT

There is disclosed a resin-sealed semiconductor device in which plural circuit portions integrally having inner and outer terminals are arranged two-dimensionally substantially in a plane and electrically independent of one another, and have leads for integrally interconnecting the inner and outer terminals, surfaces of the circuit portions are semiconductor element mounted faces with the inner and outer terminals and the leads forming one plane, the inner terminals and the leads are thinner than the outer terminals, back surfaces of the circuit portions are provided with terminal faces of the inner and outer terminals, a terminal mounted face of the semiconductor element is mounted via an insulating layer onto the semiconductor element mounted faces of the circuit portions, and the semiconductor element terminals are electrically connected with wires to the terminal faces of the inner terminal, and the whole is sealed with a resin in such a manner that the outer terminals are partially exposed to the outside.

10 Claims, 13 Drawing Sheets

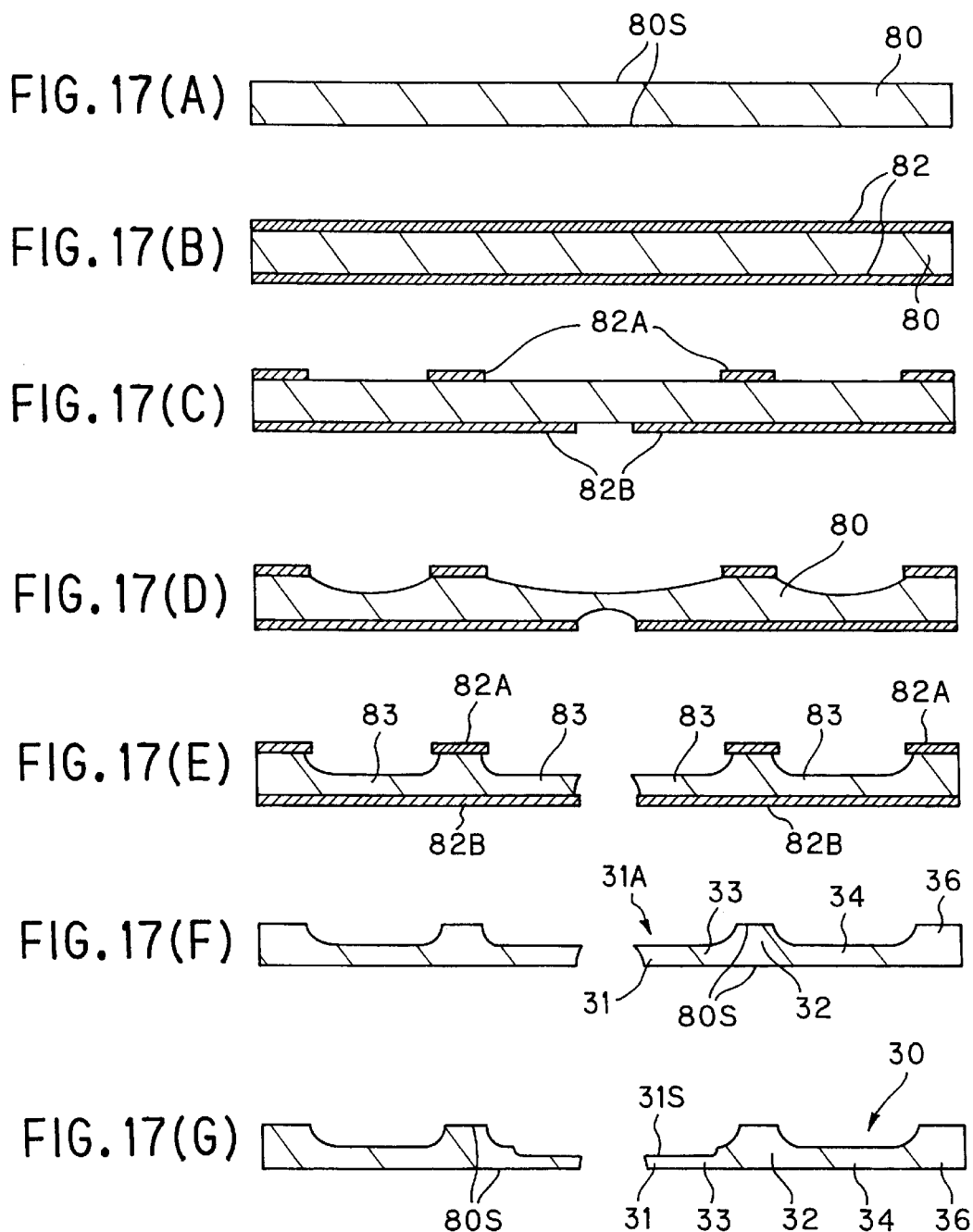

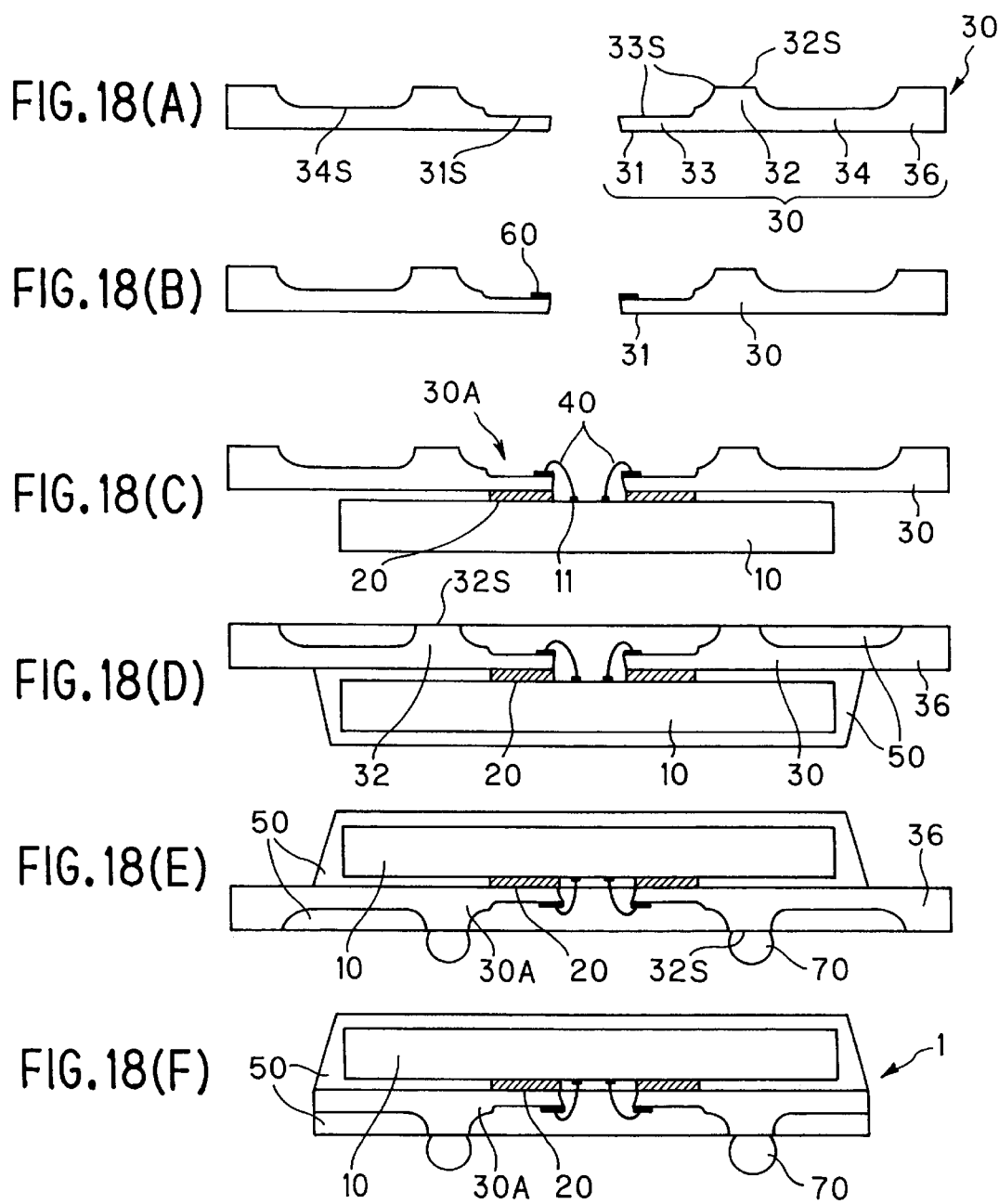

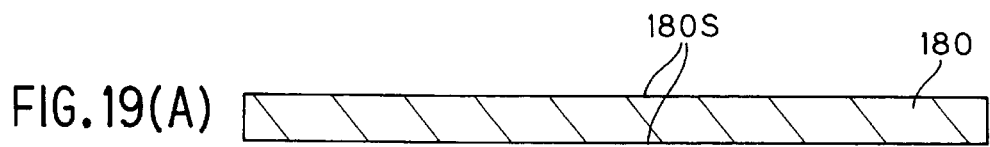
FIG.19(A)
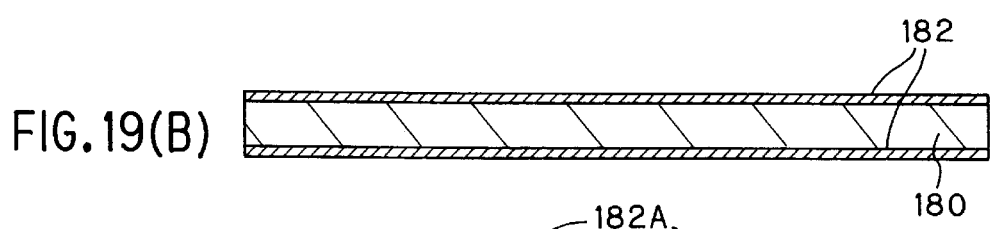
FIG.19(B)
FIG.19(C)
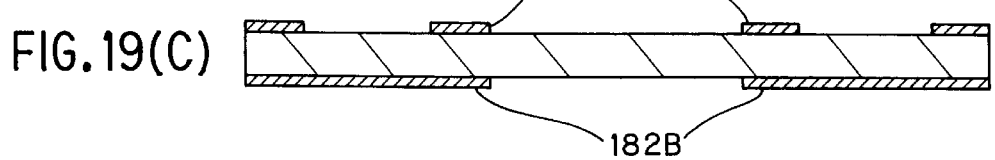
FIG.19(D)
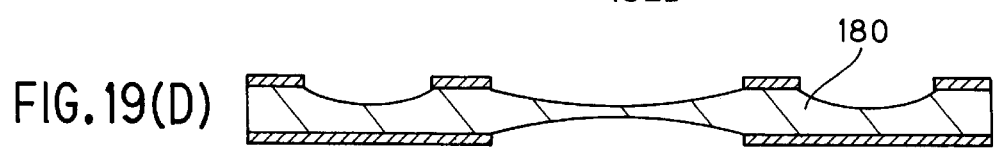
FIG.19(E)
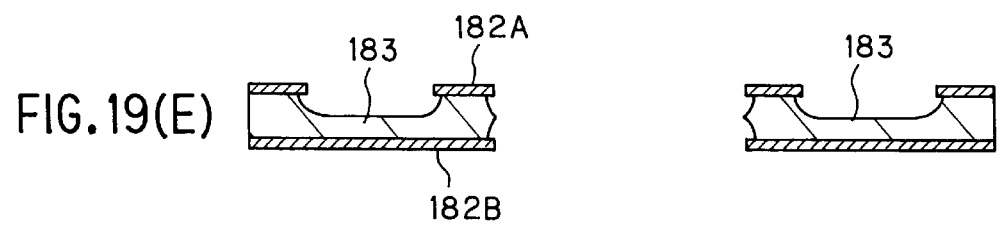
FIG.19(F)

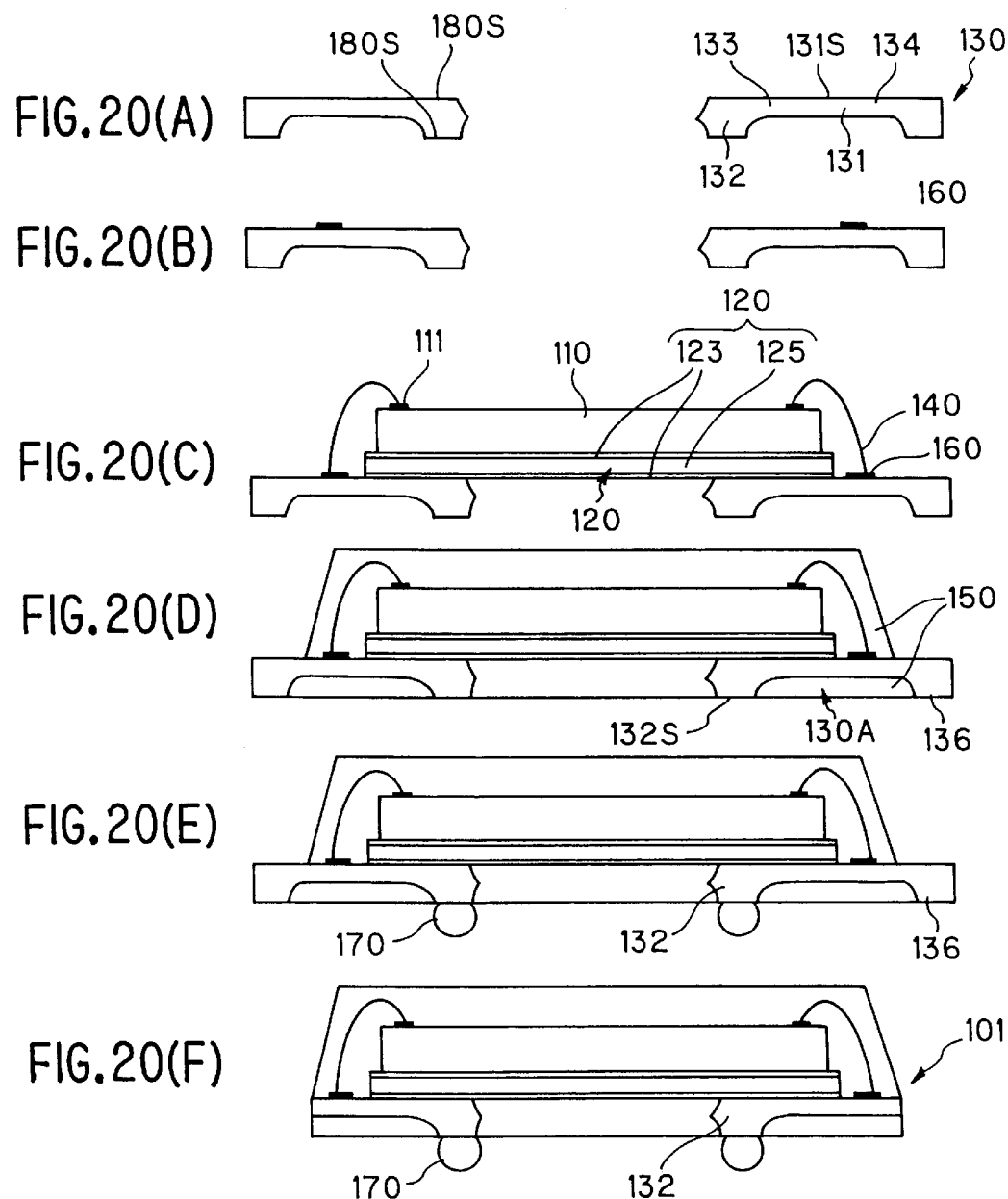

METHOD OF MANUFACTURING A CIRCUIT MEMBER FOR A RESIN-SEALED SEMICONDUCTOR DEVICE

REFERENCE TO RELATED APPLICATIONS

This present Application claims benefit and is a divisional of Application Ser. No. 09/123,558, filed on Jul. 29, 1998 now U.S. Pat. No. 6,359,221B1 from which the co-pending divisonal application Ser. No. 09/804,149, was file on Mar. 13, 2001 now U.S. Pat. No. 6,465,734 B1 the parent Application, Ser. No. 09/128,558, filed on Jul. 29, 1998 claims priority under 35 USC §1.19 of parent Japanese Patent No. 9-221208, filed Aug. 4, 1997 and parent Japanese Patent No. 9-247480, filed Aug. 29, 1997. The entire contents of the above-mentioned related applications are herein incorporated by reference.

BACKGROUND OF THE INVENTION (i) Field of the Invention

The present invention relates to a resin-sealed semiconductor device with a semiconductor element mounted thereon, a circuit member for use therein and a method of manufacturing a circuit member.

(ii) Description of the Related Art

Recently, there has been a tendency (trend) toward the progress of technique for high integration and miniaturization and toward the sophistication and lightening/shortening of electrical equipment. Therefore, semiconductor devices represented by ASIC of LSI have increasingly advanced in high integration and high function.

To accompany the advancement, also in a sealed-type semiconductor device using a lead frame, the trend of its development has progressed via surface mounting type packages such as SOJ (Small Outline J-Bend Package) and QFP (Quad Flat Package) to the miniaturization of a package mainly by thinning the package like TSOP (Thin Small Outline Package) and further to a structure of LOC (Lead On Chip) which aims at improvement of a chip containing efficiency by three-dimensionally constructing the inside of a package.

However, the resin-sealed semiconductor device is requested not only to be highly integrated and sophisticated but also to be provided with multiple pins and have a thinned and miniaturized structure. Even in the conventional package described above, since leads are drawn around in an outer peripheral portion of a semiconductor element, the miniaturization of the package is limited.

Furthermore, in the small package such as TSOP and the like, the provision of multiple pins is also limited in respect of the drawing-around of leads and the pin pitch.

SUMMARY OF THE INVENTION

Wherefore, an object of the invention is to realize a resin-sealed semiconductor device which has a high occupation ratio of a semiconductor element and can be miniaturized, enhance a mounting density onto a circuit board and further provide multiple pins and to provide a circuit member for use in the semiconductor device and a method of manufacturing the circuit member.

To attain this and other objects, the invention provides a resin-sealed semiconductor device in which plural circuit portions integrally having inner terminals and outer terminals are arranged two-dimensionally substantially in a plane and electrically independent of one another, the inner terminals of the circuit portions are electrically connected to terminals of a semiconductor element with wires and the whole is sealed with a resin in such a manner that the outer terminals are partially exposed to the outside. In the device, the circuit portions have leads for integrally interconnecting the inner terminals and the outer terminals, surfaces of the circuit portions are semiconductor element mounted faces on which the inner terminals, the leads and the outer terminals form one plane, the inner terminals and the leads are thinner than the outer terminals, back surfaces of the circuit portions are provided with terminal faces of the inner terminals and terminal faces of the outer terminals, the semiconductor element is mounted in such a manner that a terminal mounted face of the semiconductor element is mounted via an insulating layer on the semiconductor element mounted faces of the circuit portions, and the terminals of the semiconductor element are electrically connected with wires to the terminal faces of the inner terminals.

The invention also provides a resin-sealed semiconductor device in which plural circuit portions integrally having inner terminals and outer terminals are arranged two-dimensionally substantially in a plane and electrically independent of one another, the inner terminals of the circuit portions are electrically connected to terminals of a semiconductor element with wires and the whole is sealed with a resin in such a manner that the outer terminals are partially exposed to the outside. In the device, the circuit portions have leads for integrally interconnecting the inner terminals and the outer terminals, surfaces of the circuit portions are semiconductor element mounted faces on which the inner terminals, the leads and the outer terminals form one plane, the inner terminals and the leads are thinner than the outer terminals, the surfaces of the circuit portions are provided with terminal faces of the inner terminals, back surfaces of the circuit portions are provided with terminal faces of the outer terminals, the semiconductor element is mounted in such a manner that a face opposite to a terminal mounted face of the semiconductor element is mounted via an insulating layer on the semiconductor element mounted faces of the circuit portions, and the terminals of the semiconductor element are electrically connected with wires to the terminal faces of the inner terminals.

The invention provides a circuit member for use in manufacture of a resin-sealed semiconductor device in which plural circuit portions integrally having inner terminals and outer terminals are arranged two-dimensionally substantially in a plane and electrically independent of one another, the inner terminals of the circuit portions are electrically connected to terminals of a semiconductor element with wires and the whole is sealed with a resin in such a manner that the outer terminals are partially exposed to the outside. The circuit member comprises an outer frame member and plural circuit portions extended from the outer frame member via connection leads independent of one another. The circuit portions are arranged two-dimensionally substantially in a plane. Each circuit portion is constituted by integrally interconnecting the outer terminal, a lead and the inner terminal in this sequence to a tip end of each connection lead. Surfaces of the circuit portions are semiconductor element mounted faces on which the inner terminals, the leads and the outer terminals form one plane, and the inner terminals and the leads are thinner than the outer terminals.

The invention also provides a circuit member for use in manufacture of a resin-sealed semiconductor device in which plural circuit portions integrally having inner terminals and outer terminals are arranged two-dimensionally substantially in a plane and electrically independent of one another, the inner terminals of the circuit portions are electrically connected to terminals of a semiconductor element with wires and the whole is sealed with a resin in such a manner that the outer terminals are partially exposed to the outside. The circuit member comprises an outer frame member and plural circuit portions extended from the outer frame member via connection leads independent of one another. The circuit portions are arranged two-dimensionally substantially in a plane. Each circuit portion is constituted by integrally interconnecting the inner terminal, a lead and the outer terminal in this sequence to a tip end of each connection lead. Surfaces of the circuit portions are semiconductor element mounted faces on which the inner terminals, the leads and the outer terminals form one plane, and the inner terminals and the leads are thinner than the outer terminals.

The invention provides a method of manufacturing a circuit member for a resin-sealed semiconductor device in which plural circuit portions integrally having inner terminals and outer terminals are arranged two-dimensionally substantially in a plane and electrically independent of one another, the inner terminals of the circuit portions are electrically connected to terminals of a semiconductor element with wires and the whole is sealed with a resin in such a manner that the outer terminals are partially exposed to the outside. The method has an outer configuration processing process of half-etching a conductive board with one face of the conductive board being left as a surface to form the circuit member provided with an outer frame member and plural circuit portions extended from the outer frame member via connection leads independent of one another. In the outer configuration processing process, plural circuit portions are arranged two-dimensionally substantially in a plane, and each circuit portion is constituted by integrally interconnecting the outer terminal, a lead and the inner terminal in this sequence to a tip end of each connection lead. Surfaces of the circuit portions are made as semiconductor element mounted faces on which the inner terminals, the leads and the outer terminals form one plane, the inner terminals and the leads are made thinner than the conductive board, and the outer terminals are made as thick as the conductive board.

The invention further provides a method of manufacturing a circuit member for a resin-sealed semiconductor device in which plural circuit portions integrally having inner terminals and outer terminals are arranged two-dimensionally substantially in a plane and electrically independent of one another, the inner terminals of the circuit portions are electrically connected to terminals of a semiconductor element with wires and the whole is sealed with a resin in such a manner that the outer terminals are partially exposed to the outside. The method has an outer configuration processing process of half-etching a conductive board with one face of the conductive board being left as a surface to form the circuit member provided with an outer frame member and plural circuit portions extended from the outer frame member via connection leads independent of one another. In the outer configuration processing process, plural circuit portions are arranged two-dimensionally substantially in a plane, and each circuit portion is constituted by integrally interconnecting the inner terminal, a lead and the outer terminal in this sequence to a tip end of each connection lead. Surfaces of the circuit portions are made as semiconductor element mounted faces on which the inner terminals, the leads and the outer terminals form one plane, the inner terminals and the leads are made thinner than the conductive board, and the outer terminals are made as thick as the conductive board.

In the aforementioned invention, the occupation ratio of the semiconductor element in the resin-sealed semiconductor device is raised, the semiconductor device can be miniaturized, and a mounting density onto a circuit board can be enhanced. Furthermore, by forming outer electrodes on the outer terminals, multiple pins can be easily mounted, which is difficult in the conventional TSOP or another small-sized semiconductor device.

BRIEF DESCRIPTION OF THE DRAWINGS

FIG. 17 is a process diagram showing an embodiment of a method of manufacturing the circuit member according to the invention.

FIG. 18 is a process diagram showing a method of manufacturing the resin-sealed semiconductor device shown in FIGS. 1 to 4 by using the circuit member according to the invention.

FIG. 19 is a process diagram showing anther embodiment of the method of manufacturing the circuit member according to the invention.

FIG. 20 is a process diagram showing a method of manufacturing the resin-sealed semiconductor device shown in FIGS. 7 to 10 by using the circuit member according to the invention.

DETAILED DESCRIPTION OF THE PREFERRED EMBODIMENTS

Preferred embodiments of the invention will be described with reference to the accompanying drawings.

Resin-sealed Semiconductor Device

First, a resin-sealed semiconductor device of the invention will be described.

Figure 1:
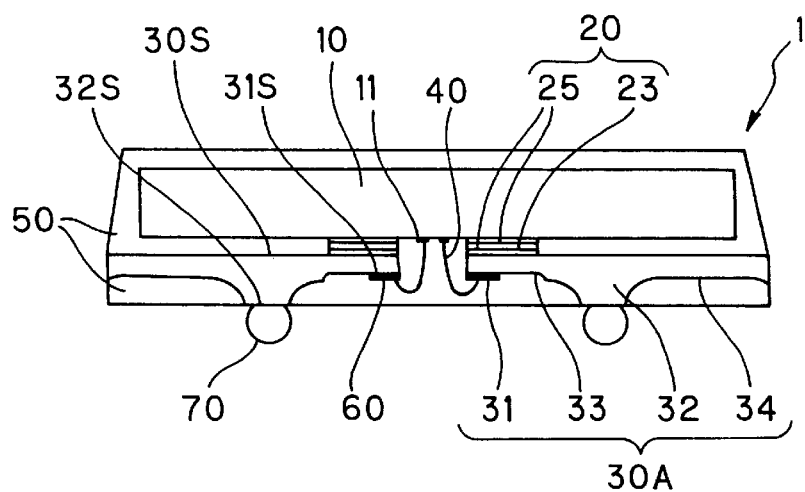
FIG. 1 is a diagrammatic view showing a structure of an embodiment of a resin-sealed semiconductor device according to the invention.
Figure 2:
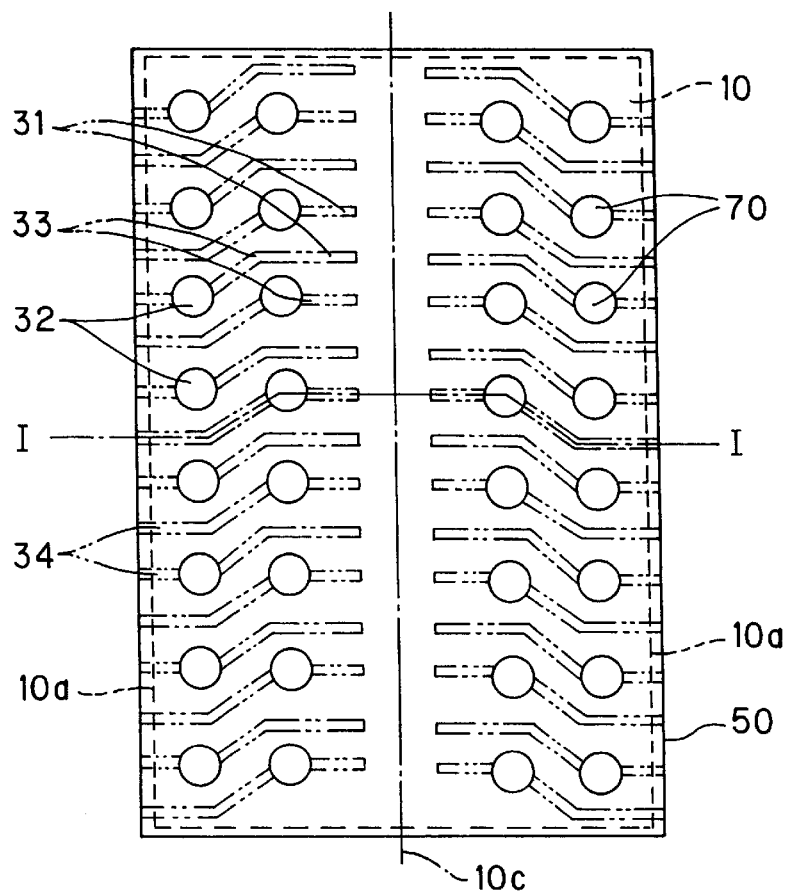
FIG. 2 is a plan view of the resin-sealed semiconductor device of FIG. 1 seen from an outer-electrode side.
Figure 3:
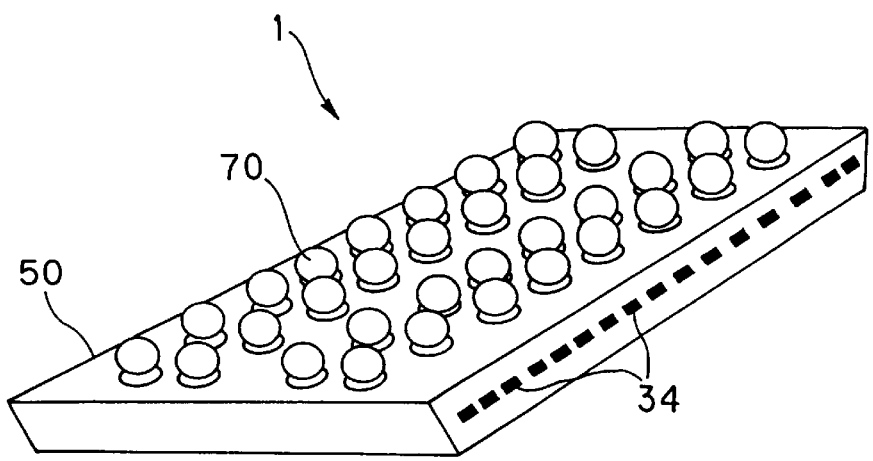
FIG. 3 is a perspective view of the outer-electrode side of the resin-sealed semiconductor device shown in FIG. 1.
Figure 4:
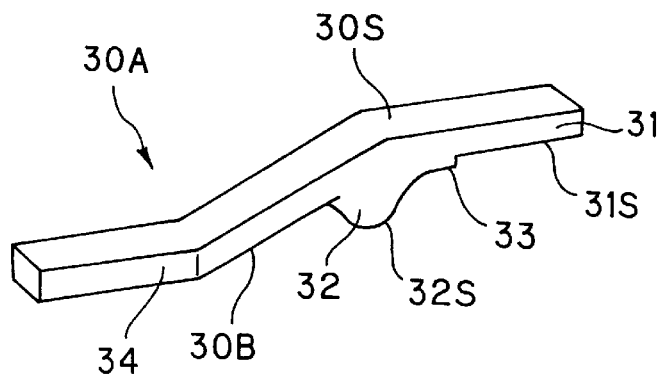
FIG. 4 is an enlarged perspective view showing one circuit portion of the resin-sealed semiconductor device shown in FIG. 1.

FIG. 1 is a diagrammatic view showing a resin-sealed semiconductor device according to an embodiment of the invention, and FIG. 2 is a view of the resin-sealed semiconductor device shown in FIG. 1 as seen from an outerterminal side. FIG. 3 is a perspective view clearly showing the outer-terminal side and side faces of the resin-sealed semiconductor device shown in FIG. 1. Furthermore, FIG. 4 is an enlarged perspective view showing one circuit portion of the resin-sealed semiconductor device shown in FIG. 1. Additionally, FIG. 1 is a vertical sectional view taken along a one-dot chain line I—I of FIG. 2. Moreover, to facilitate the understanding of a positional relationship of the circuit portion and a semiconductor element in FIG. 2, the circuit portion is shown by a two-dot chain line while the semiconductor element is shown by a chain line.

In a resin-sealed semiconductor device 1 shown in FIGS. 1 to 4, plural circuit portions 30A are arranged two-dimensionally substantially in a plane and electrically independent of one another. The circuit portion 30A has a lead 33 for integrally interconnecting an inner terminal 31 and an outer terminal 32. Furthermore, since the resin-sealed semiconductor device 1 is manufactured by using a circuit member described later, a connection lead 34 remains extending from the outer terminal 32 toward the side face of the resin-sealed semiconductor device 1. A surface 30S of the circuit portion 30A is a semiconductor element mounted face on which the inner terminal 31, the lead 33 and the outer terminal 32 form one plane. Additionally, the inner terminal 31 and the lead 33 are thinner than the outer terminal 32, and a back surface 30B of the circuit portion 30A is provided with a terminal face 31S of the inner terminal 31 and a terminal face 32S of the outer terminal 32. Therefore, on the back surface 30B of the circuit portion 30A, the terminal face 32S of the outer terminal 32 is protruded in a convex configuration from the back surface. Additionally, a silver plating layer 60 is formed on the terminal face 31S of the inner terminal 31.

For a semiconductor element 10, a face of the semiconductor element 10 on the side of terminals 11 is mounted via insulating layers 20 on the semiconductor element mounted faces 30S of the circuit portions 30A. The terminals 11 of the semiconductor element 10 are electrically connected with wires 40 to the terminal faces 31S (the silver plating layers 60) of the inner terminals 31.

The semiconductor element 10, the circuit portions 30A and the wires 40 are sealed with a sealing member 50 in such a manner that the outer terminals 32 are partially exposed to the outside. For the sealing member 50, a known sealing resin material for use in the resin-sealed semiconductor device can be used. In the embodiment shown in FIG. 1, only the terminal faces 32S of the outer terminals 32 are exposed to the outside, and outer electrodes 70 consisting of solders are formed on the exposed faces. Thereby, a BGA (Ball Grid Array) type semiconductor device is formed. When the resin-sealed semiconductor device 1 is mounted on the circuit board, the outer terminals 32 can be electrically connected to an outside circuit by melting and solidifying the outer electrodes 70.

In the resin-sealed semiconductor device 1, at least the terminal faces 31S of the inner terminals 31 are made flat through coining, and the silver plating layers 60 are formed on the terminal faces 31S.

Furthermore, in the resin-sealed semiconductor device 1, the terminals 11 of the semiconductor element 10 are arranged along a center line 10c between a pair of sides 10a of the terminal mounted face of the semiconductor element 10 (refer to FIGS. 1 and 2). On the other hand, the inner terminals 31 of the circuit portions 30A are arranged along the center line 10c to sandwich the center line 10c from opposite sides. As aforementioned, the terminal mounted face of the semiconductor element 10 is laid via the insulating layers 20 on the surfaces (semiconductor element mounted faces) 30S of the circuit portions 30A, and this structure is called LOC (Lead On Chip). Moreover, in the resin-sealed semiconductor device 1, a resin sealed region is substantially adapted to a size of the semiconductor element 10, and the structure is called CSP (Chip Size Package) in which the outer configuration dimension of the semiconductor device is substantially the same as that of the semiconductor element.

In the embodiment shown in FIG. 1, the insulating layer 20 is provided with adhesive layers 25 on opposite faces of an electrically insulating base film 23, or a marketed diatouch agent can be used. For example, an adhesive double coated tape like UX1W (manufactured by Kabushiki Kaisha Tomoegawa Seishisho) with RXF layers (adhesives manufactured by Kabushiki Kaisha Tomoegawa Seishisho) formed on opposite faces of UPLEX (electrically insulating base film manufactured by Ube Kosan Kabushiki Kaisha) can be used. Additionally, a 42 alloy (Fe alloy containing 41% of Ni), a copper alloy or the like is used as a material of the circuit portion 30A.

Figure 5:
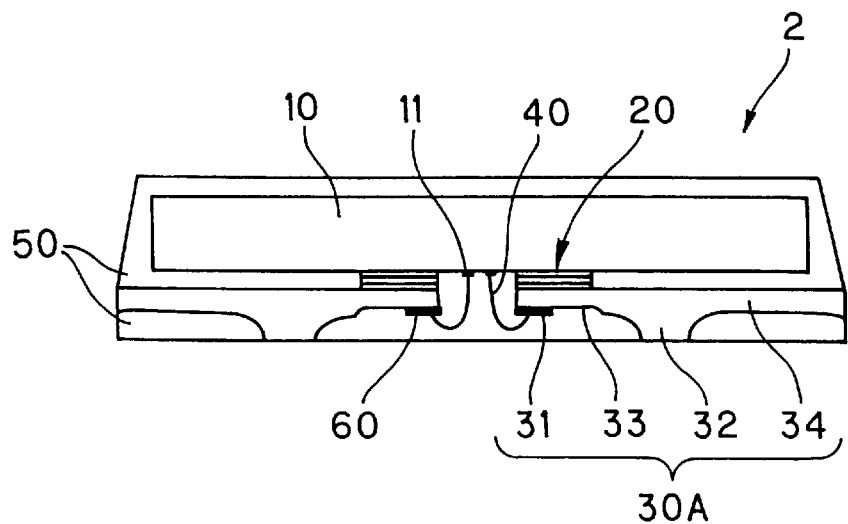
FIG. 5 is a diagrammatic view showing a constitution of another embodiment of the resin-sealed semiconductor device according to the invention.

FIG. 5 is a diagrammatic view showing a constitution of another embodiment of the resin-sealed semiconductor device according to the invention. As shown in FIG. 5, in a resin-sealed semiconductor device 2 of the invention, different from the aforementioned resin-sealed semiconductor device 1, the outer electrodes 70 are not formed on the exposed faces (terminal faces 32S) of the outer terminals 32.

Figure 6:
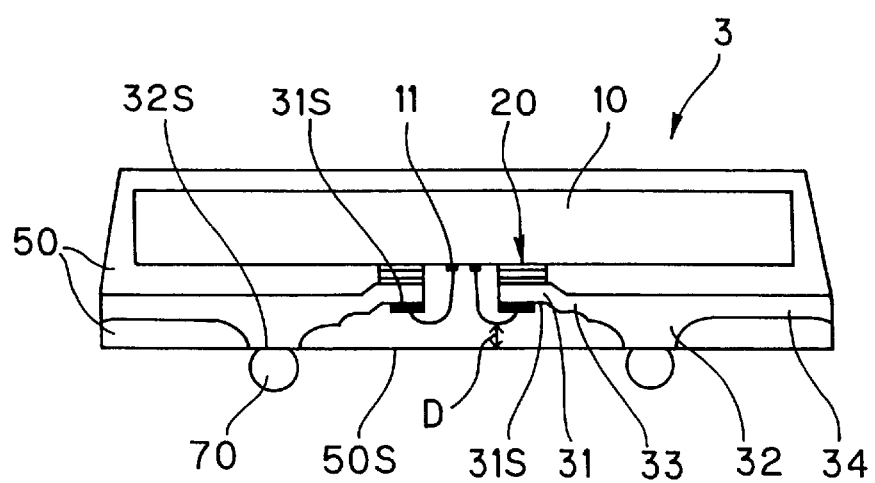
FIG. 6 is a diagrammatic view showing a constitution of another embodiment of the resin-sealed semiconductor device according to the invention.

FIG. 6 is a diagrammatic view showing a constitution of another embodiment of the resin-sealed semiconductor device according to the invention. In FIG. 6, a resin-sealed semiconductor device 3 of the invention is an LOC (Lead On Chip) type semiconductor device which is different from the aforementioned resin-sealed semiconductor device 1 in that the semiconductor element 10 is mounted on raised inner terminals 31. Due to the raised inner terminals 31, a distance between the terminal faces 31 S of the inner terminals 31 and an outer-terminal mounted face SOS of the sealing member 50 is increased. Therefore, a sufficient distance "D" can be obtained between the wires 40 connecting the terminals 11 of the semiconductor element 10 to the terminal faces 31 S of the inner terminals 31 and the outer-electrode mounted face SOS of the sealing member 50, the wires 40 can be sealed more firmly. In the resin-sealed semiconductor device 3, the exposed faces (terminal faces 32S) of the outer terminals 32 optionally may not be provided with the outer electrodes 70 in the same manner as the resin-sealed semiconductor device 2.

Additionally, the number of terminals, the arrangement of the terminals and the like in the resin-sealed semiconductor device 1, 2 or 3 are shown by way of illustration, and it is natural that the invention is not restricted to the embodiments. For example, by two-dimensionally arranging the terminals 11 along four sides of the semiconductor element 10 and by arranging the circuit portions 30A along a periphery of the semiconductor element 10, more pins can further be mounted on the resin-sealed semiconductor device 1, 2 or 3.

Figure 7:
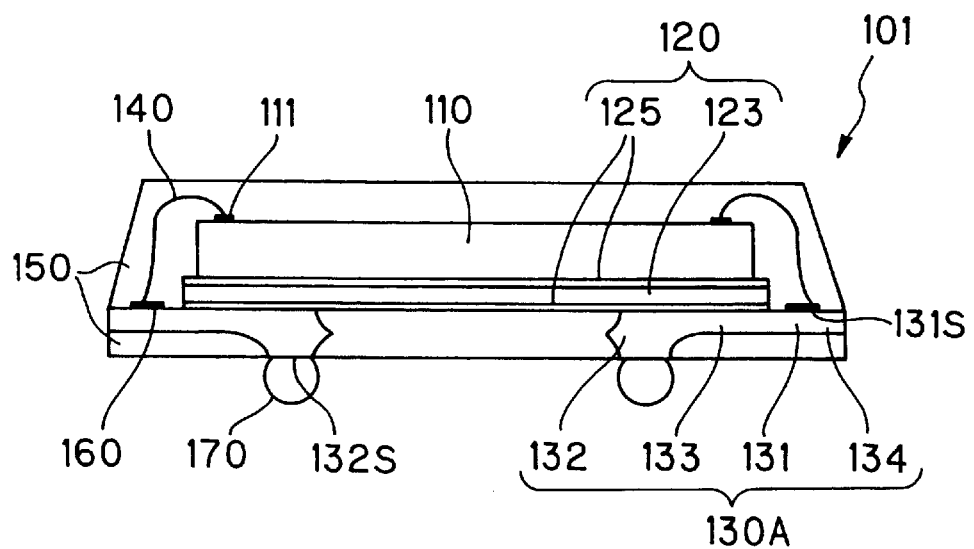
FIG. 7 is a diagrammatic view showing a constitution of another embodiment of the resin-sealed semiconductor device according to the invention.
Figure 8:
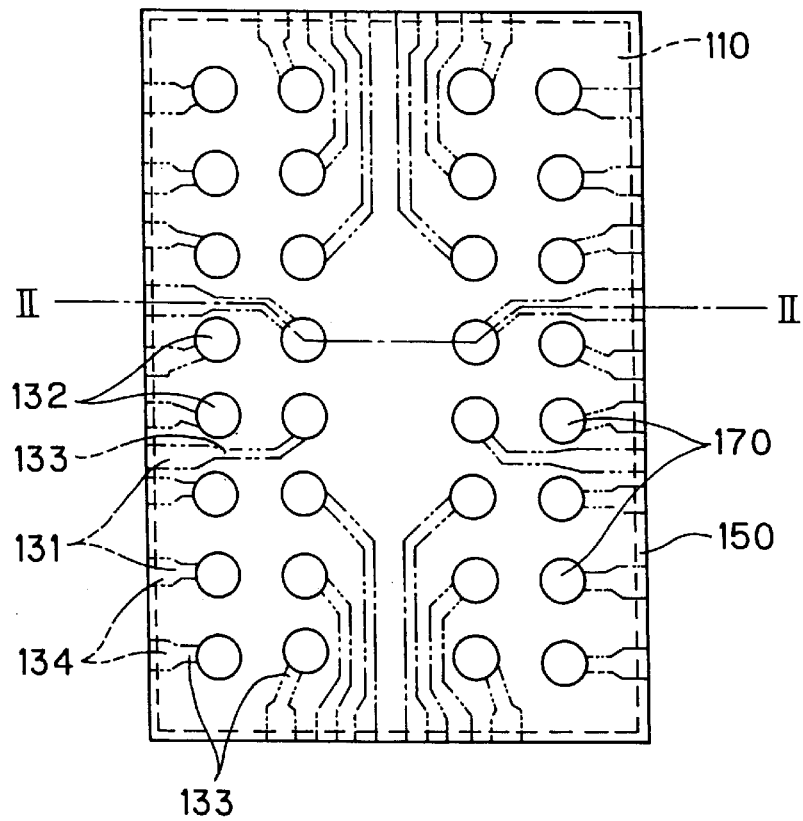
FIG. 8 is a plan view of the resin-sealed semiconductor device of FIG. 7 seen from an outer-electrode side.
Figure 9:
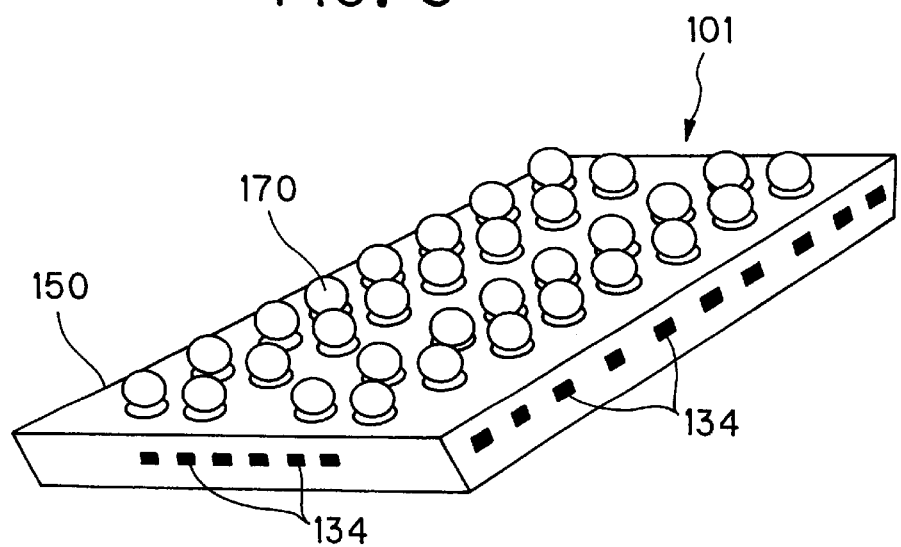
FIG. 9 is a perspective view of the outer-electrode side of the resin-sealed semiconductor device shown in FIG. 7.
Figure 10:
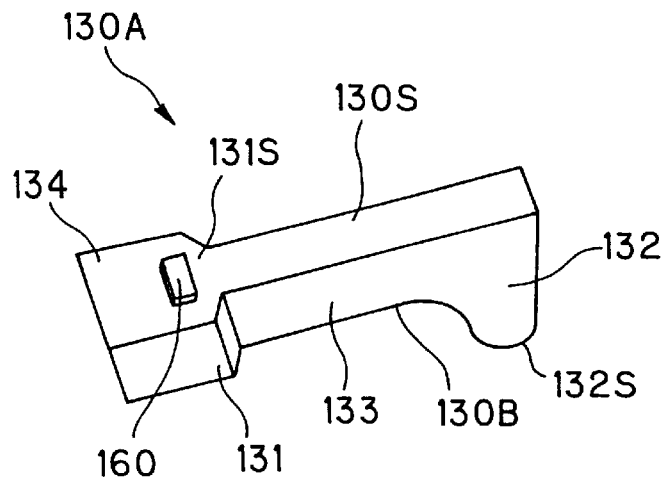
FIG. 10 is an enlarged perspective view showing one circuit portion of the resin-sealed semiconductor device shown in FIG. 7.

FIG. 7 is a diagrammatic view showing another embodiment of the resin-sealed semiconductor device according to the invention, and FIG. 8 is a view of the resin-sealed semiconductor device shown in FIG. 7 as seen from an outer-terminal side. FIG. 9 is a perspective view clearly showing the outer-terminal side and side faces of the resin-sealed semiconductor device shown in FIG. 7. Furthermore, FIG. 10 is an enlarged perspective view of one circuit portion of the resin-sealed semiconductor device shown in FIG. 7. Additionally, FIG. 7 is a vertical sectional view taken along a one-dot chain line II—II of FIG. 8. Moreover, to facilitate the understanding of a positional relationship of the circuit portion and a semiconductor element in FIG. 8, the circuit portion is shown by a two-dot chain line while a semiconductor element region is shown by a chain line.

In a resin-sealed semiconductor device 101 shown in FIGS. 7 to 10, plural circuit portions 130A are arranged two-dimensionally substantially in a plane and electrically independent of one another. The circuit portion 130A has a lead 133 for integrally interconnecting an inner terminal 131 and an outer terminal 132. Furthermore, since the resin-sealed semiconductor device 101 is manufactured by using a circuit member described later, a connection lead 134 remains extending from the outer terminal 132 toward the side face of the resin-sealed semiconductor device 101. A surface 130S of the circuit portion 130A is a semiconductor element mounted face on which the inner terminal 131, the lead 133 and the outer terminal 132 form one plane. Additionally, the inner terminal 131 and the lead 133 are thinner than the outer terminal 132, a surface 130S of the circuit portion 130A is provided with a terminal face 131S of the inner terminal 131, and a back surface 130B of the circuit portion 130A is provided with a terminal face 132S of the outer terminal 132. Therefore, on the back surface 130B of the circuit portion 130A, the terminal face 132S of the outer terminal 132 is protruded in a convex configuration from the back surface. Additionally, a silver plating layer 160 is formed on the terminal face 131S of the inner terminal 131.

For a semiconductor element 110, a face of the semiconductor element 110 opposite to the side of terminals 111 is mounted via an insulating layer 120 on the semiconductor element mounted faces 130S of the circuit portions 130A. The terminals 111 of the semiconductor element 110 are electrically connected with wires 140 to the terminal faces 131S (the silver plating layers 160) of the inner terminals 131.

The semiconductor element 110, the circuit portions 130A and the wires 140 are sealed with a sealing member 150 in such a manner that the outer terminals 132 are partially exposed to the outside. For the sealing member 150, a known sealing resin material for use in the resin-sealed semiconductor device can be used. In the embodiment shown in FIG. 7, only the terminal faces 132S of the outer terminals 132 are exposed to the outside, and outer electrodes 170 consisting of solders are formed on the exposed faces. Thereby, a BGA (Ball Grid Array) type semiconductor device is formed. When the resin-sealed semiconductor device 101 is mounted on the circuit board, the outer terminals 132 can be electrically connected to an outside circuit by melting and solidifying the outer electrodes 170.

Moreover, in the resin-sealed semiconductor device 101, the inner terminals 131 are arranged along each side (four sides) of the semiconductor element 110 and outside a semiconductor element region (region surrounded with a chain line in FIG. 8). As aforementioned, the face of the semiconductor element 110 opposite to the terminal mounted face is laid via the insulating layer 120 on the surfaces (semiconductor element mounted faces) 130S of the circuit portions 130A, and this structure is called COL (Chip On Lead). Moreover, in the resin-sealed semiconductor device 101, a resin sealed region is substantially adapted to a size of the semiconductor element 110, and the structure is called CSP (Chip Size Package) in which the outer configuration dimension of the semiconductor device is substantially the same as that of the semiconductor element.

In the embodiment shown in FIG. 7, the insulating layer 120 is provided with adhesive layers 125 on opposite faces of an electrically insulating base film 123, or a marketed dia-touch agent can be used. For example, an adhesive double coated tape like UX1W (manufactured by Kabushiki Kaisha Tomoegawa Seishisho) with RXF layers (adhesives manufactured by Kabushiki Kaisha Tomoegawa Seishisho) formed on opposite faces of UPLEX (electrically insulating base film manufactured by Ube Kosan Kabushiki Kaisha) can be used. Additionally, a 42 alloy (Fe alloy containing 41% of Ni), a copper alloy or the like is used as a material of the circuit portion 130A.

Figure 11:
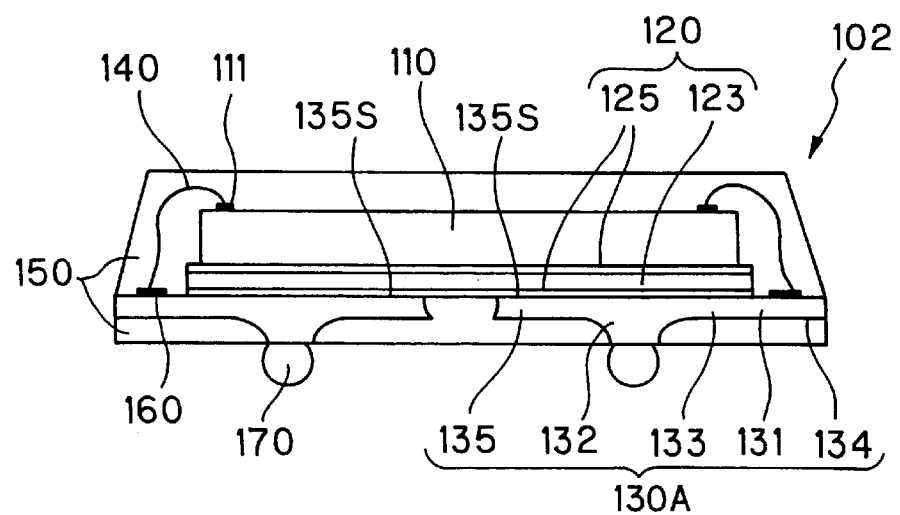
FIG. 11 is a diagrammatic view showing a constitution of another embodiment of the resin-sealed semiconductor device according to the invention.

FIG. 11 is a diagrammatic view showing another embodiment of the resin-sealed semiconductor device according to the invention. In FIG. 11, a resin-sealed semiconductor device 102 of the invention is constituted by providing the circuit portions 130A of the aforementioned resin-sealed semiconductor device 101 with semiconductor mounting leads 135. Specifically, the semiconductor mounting leads 135 are integrally extended from the outer terminals 132 of the circuit portions 130A toward the inside of the resin-sealed semiconductor device 102. The semiconductor mounting lead 135 is thinner than the outer terminal 132, and its surface 135S forms the same plane as the surface (semiconductor element mounted face) 130S of the circuit portion 130A. By provision of the semiconductor mounting leads 135, the semiconductor element 110 can be fixed and mounted onto the circuit portions 130A more firmly.

Figure 12:
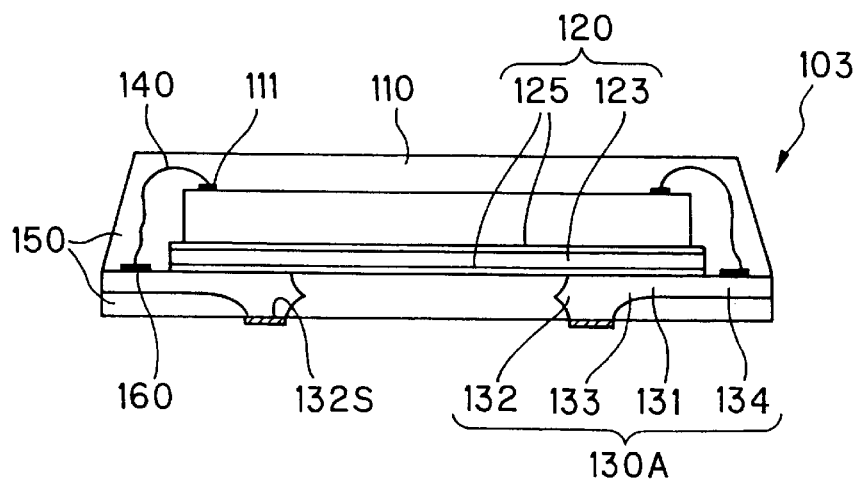
FIG. 12 is a diagrammatic view showing a constitution of another embodiment of the resin-sealed semiconductor device according to the invention.

FIG. 12 is a diagrammatic view showing a constitution of another embodiment of the resin-sealed semiconductor device according to the invention. As shown in FIG. 12, in a resin-sealed semiconductor device 103 of the invention, different from the aforementioned resin-sealed semiconductor device 101, the outer electrodes 170 are not formed on the exposed faces (terminal faces 132S) of the outer terminals 132, and portions to be connected to a printed board are formed of solder paste or the like.

Additionally, the number of terminals, the arrangement of the terminals and the like in the resin-sealed semiconductor device 101, 102 or 103 are shown by way of illustration, and it is natural that the invention is not restricted to the embodiments.

Circuit Member

A circuit member of the invention will be described.

Figure 13:
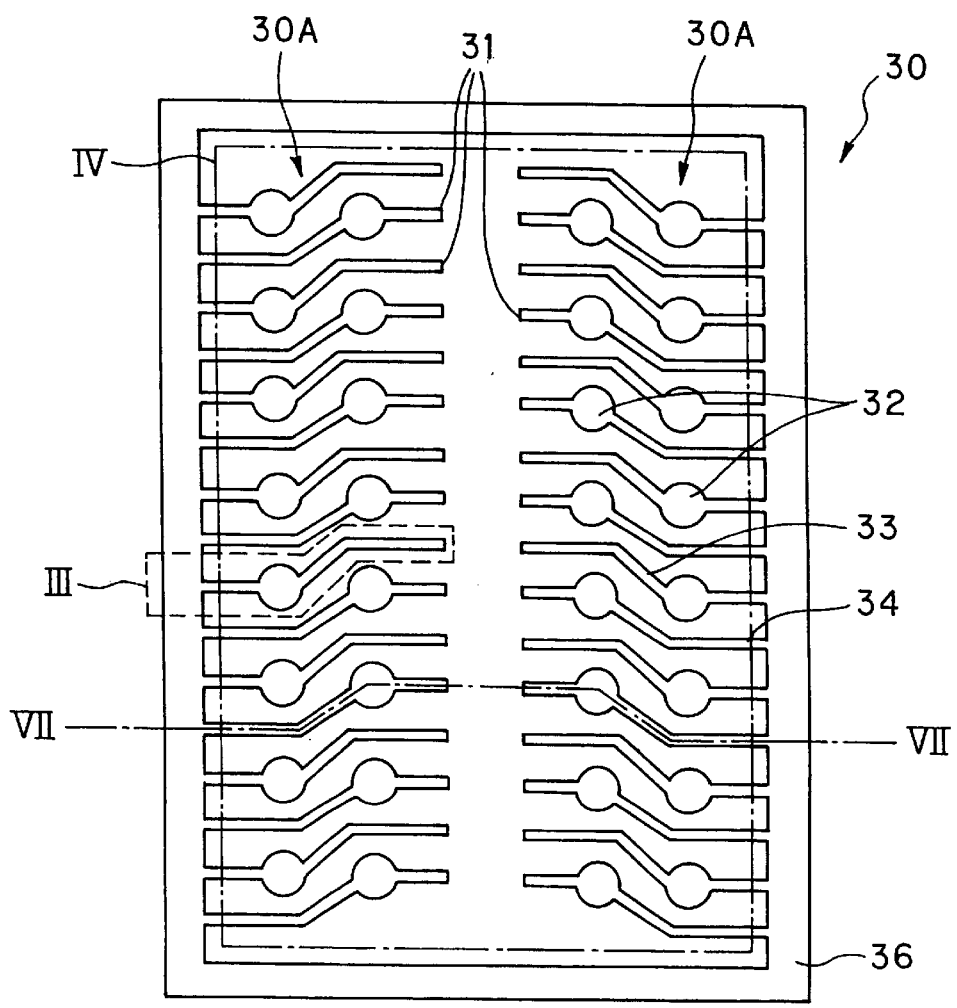
FIG. 13 is a plan view showing an embodiment of a circuit member according to the invention.
Figure 14:
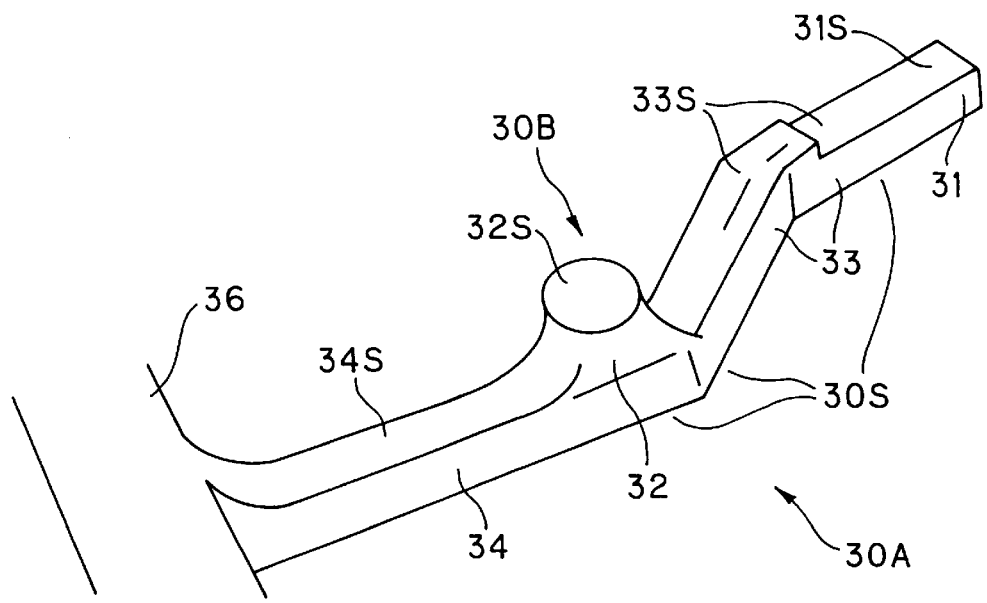
FIG. 14 is an enlarged perspective view of a section of the circuit member surrounded with a chain line III shown in FIG. 13 as seen from a back-surface side.

FIG. 13 is a plan view showing an embodiment of a circuit member of the invention, and FIG. 14 is an enlarged perspective view of a section surrounded with a chain line III of the circuit member shown in FIG. 13.

In FIGS. 13 and 14, a circuit member 30 of the invention is a circuit member which can be used in manufacture of the resin-sealed semiconductor device 1, 2 or 3 of the invention, and is provided with an outer frame member 36 and plural circuit portions 30A mutually independently extended from the outer frame member 36 via connection leads 34. A region surrounded with a one-dot chain line IV of FIG. 13 is a region used with a resin sealed therein when the resin-sealed semiconductor device of the invention is manufactured, and a region outside the one-dot chain line IV is finally separated and removed.

An outer configuration and an inner opening configuration of the outer frame member 36 are rectangular. The connection leads 34 are extended from a pair of opposite sides defining an inner opening of the outer frame member 36 into the same plane. The outer frame member 36 usually has the same thickness as the conductive board which is a material of the circuit member 30. Furthermore, as aforementioned, since the region outside the one-dot chain line IV of FIG. 13 is finally separated and removed after resin sealing, as shown in FIG. 1, the connection leads 34 partially remain inside the resin-sealed semiconductor device 1.

The circuit portion 30A is formed by integrally interconnecting the outer terminal 32, the lead 33 and the inner terminal 31 in this sequence on a tip end of the connection lead 34. The inner terminal 31 and the lead 33 are thinner than the outer terminal 32. The thickness of the outer terminal 32 is set to the same thickness as that of the conductive board being the material of the circuit member 30. Additionally, the back surface 30B of the circuit portion 30A is provided with the terminal face 31S of the inner terminal 31 and the terminal face 32S of the outer terminal 32. Moreover, the surface 30S of the circuit portion 30A is a semiconductor element mounted face on which the inner terminal 31, the lead 33 and the outer terminal 32 form one plane. The semiconductor element mounted face is usually constituted by using a surface of the conductive board or material of the circuit member 30 as it is. Therefore, on the back surface 30B of the circuit portion 30A, the terminal face 32S of the outer terminal 32 is protruded in a convex configuration from the back surface. In the embodiment shown in FIG. 14, the terminal face 31S of the inner terminal 31 is made flat through coining.

A 42 alloy (Fe alloy containing 41% of Ni), a copper, a copper alloy or the like is used as a material of the circuit member 30.

Additionally, in a case of a circuit member for use in the resin-sealed semiconductor device 3 of the invention, the inner terminals 31 are raised.

Furthermore, the number of terminals, the arrangement of the terminals and the like in the aforementioned circuit member are shown by way of illustration, and it is natural that the invention is not restricted to the embodiment.

Figure 15:
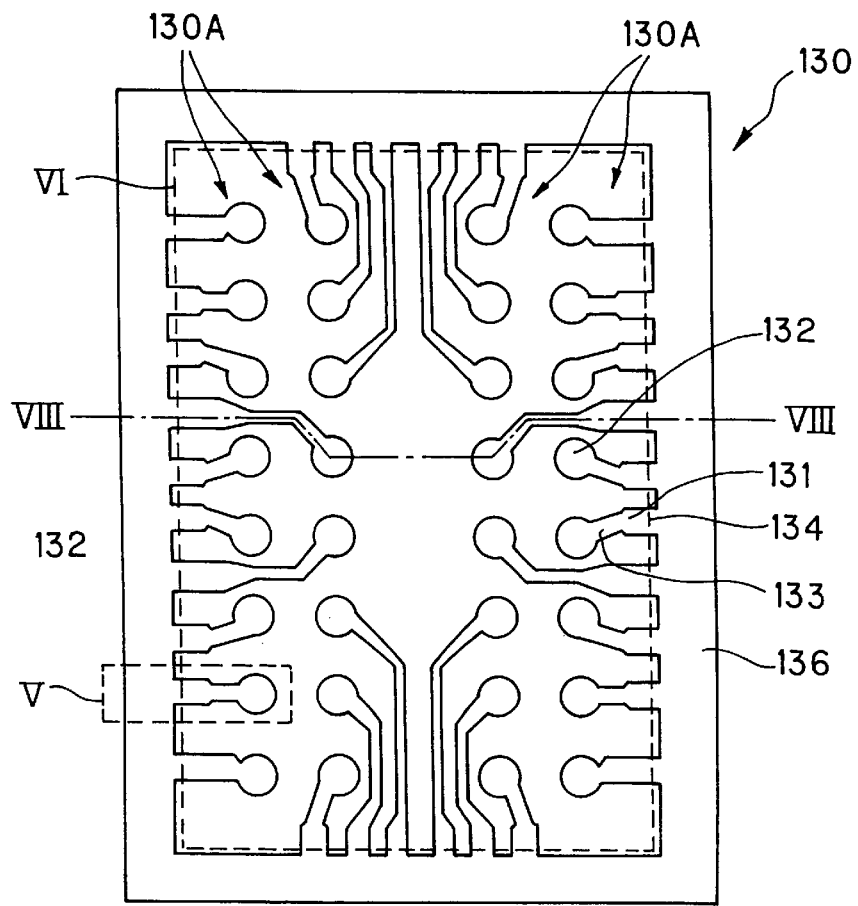
FIG. 15 is a plan view showing another embodiment of the circuit member according to the invention.
Figure 16:
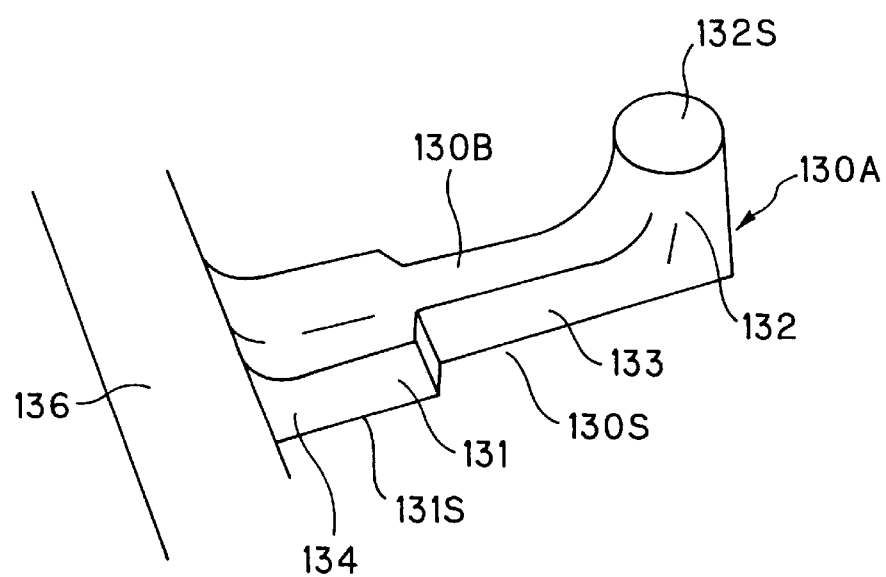
FIG. 16 is an enlarged perspective view of a section of the circuit member surrounded with a chain line V shown in FIG. 15 as seen from a back-surface side.

FIG. 15 is a plan view showing another embodiment of the circuit member of the invention, and FIG. 16 is an enlarged perspective view of a section surrounded with a chain line V of the circuit member shown in FIG. 15.

In FIGS. 15 and 16, a circuit member 130 of the invention is a circuit member which can be used in manufacture of the resin-sealed semiconductor device 101, 102 or 103 of the invention, and is provided with an outer frame member 136 and plural circuit portions 130A mutually independently extended from the outer frame member 136 via connection leads 134. A region surrounded with a one-dot chain line VI of FIG. 15 is a region used with a resin sealed therein when the resin-sealed semiconductor device of the invention is manufactured, and a region outside the one-dot chain line VI is finally separated and removed.

An outer configuration and an inner opening configuration of the outer frame member 136 are rectangular. The connection leads 134 are extended from a pair of opposite sides defining an inner opening of the outer frame member 136 into the same plane. The outer frame member 136 usually has the same thickness as the conductive board being a material of the circuit member 130. Furthermore, as aforementioned, since the region outside the one-dot chain line VI of FIG. 15 is finally separated and removed after resin sealing, as shown in FIG. 7, the connection leads 134 partially remain inside the resin-sealed semiconductor device 101.

The circuit portion 130A is formed by integrally interconnecting the inner terminal 131, the lead 133 and the outer terminal 132 in this sequence on a tip end of the connection lead 134. The inner terminal 131 and the lead 133 are thinner than the outer terminal 132. The thickness of the outer terminal 132 is set to the same thickness as that of the conductive board being the material of the circuit member 130. Additionally, the surface 130S of the circuit portion 130A is provided with the terminal face 131S of the inner terminal 131 while the back surface 130B is provided with the terminal face 132S of the outer terminal 132. Moreover, the surface 130S of the circuit portion 130A is a semiconductor element mounted face on which the inner terminal 131, the lead 133 and the outer terminal 132 form one plane. The semiconductor element mounted face is usually constituted by using a surface of the conductive board or material of the circuit member 130 as it is. Therefore, on the back surface 130B of the circuit portion 130A, the terminal face 132S-of the outer terminal 132 is protruded in a convex configuration from the back surface.

A 42 alloy (Fe alloy containing 41% of Ni), a copper, a copper alloy or the like is used as a material of the circuit member 130.

Furthermore, the number of terminals, the arrangement of the terminals and the like in the aforementioned circuit member are shown by way of illustration, and it is natural that the invention is not restricted to the embodiment.

Method of Manufacturing Circuit Member

A method of manufacturing the circuit member of the invention will be described.

The method of manufacturing the circuit member of the invention is described by using a case where the circuit member 30 shown in FIGS. 13 and 14 is manufactured.

FIG. 17 is a process diagram showing an embodiment of the method of manufacturing the circuit member according to the invention. Each process is shown in a cross section taken along a one-dot chain line VII—VII shown in FIG. 13.

First, a conductive board 80 with a thickness of about 100 to 250 $\mu$m formed of a 42 alloy (Fe alloy containing 41% of Ni) or the like is prepared as a material of the circuit member. After well cleaning the conductive board 80 by degreasing opposite faces 80S or otherwise (FIG. 17A), a photosensitive resist is applied to the opposite faces 80S and dried to form resist layers 82 (FIG. 17B). As the photosensitive resist, a known conventional resist can be used and, for example, a casein resist using a photosensitive material of potassium bichromate, a negative liquefied resist (PMER resist) manufactured by Tokyo Ouka Kogyo Kabushiki Kaisha or the like can be used.

Subsequently, after only predetermined sections of the resist layers 82 are exposed to light via predetermined pattern masks, developing is performed to form resist patterns 82A on one face of the conductive board 80 and resist patterns 82B on the other face (FIG. 17C). In a region on which the inner terminals, the leads and the connection leads are to be formed, one face of the conductive board 80 is not covered with the resist patterns 82A.

Subsequently, by using the resist patterns 82A and 82B as films resistant to etching agents, the conductive board 80 is etched with an etching liquid. The etching proceeds as shown in FIG. 17D, and is completed as shown in FIG. 17E. Since in the region with the inner terminals, the leads and the connection leads to be formed thereon one face of the conductive board 80 is not covered with the resist patterns 82A, the etching proceeds only from one side. This is called a half etching in the invention. Through the half etching, thin-gage portions 83 are formed, and sections in which no resist pattern 82A or 82B is present are melted and removed.

For the etching liquid, an aqueous solution of ferric chloride is usually used to spray and etch the opposite faces of the conductive board 80. By adjusting an etching quantity in the half etching process, a thickness of each thin-gage portion 83 can be regulated.

Subsequently, by peeling and removing the resist patterns 82A and 82B, the inner terminals 31, the leads 33 and the connection leads 34 are formed thinner than the material of the conductive board 80, and the outer terminals 32 and the outer frame member 36 are formed as thick as the material of the conductive board 80 (FIG. 17F). A portion between adjoining inner terminals 31 is separated because the etching proceeds from the opposite faces. The material face 80S of the conductive board 80 is left as one face (surface) of the inner terminal 31, the lead 33 or the connection lead 34. Opposite faces of the outer terminal 32 or the outer frame member 36 are formed by the material faces 80S of the conductive board 80.

Subsequently, by coining a terminal-face forming side 31A of the inner terminal 31, the flat terminal face 31S is formed to obtain the circuit member 30 of the invention (FIG. 17G).

Additionally, for reasons of productivity, when etching is performed, plural faces are processed as aforementioned.

Moreover, for the circuit member to be used in the resin-sealed semiconductor device 3 of the invention, the inner terminal 31 is raised by using a predetermined metal mold. The raising may be performed after formation of the silver plating layer 60 described later.

A method of manufacturing the resin-sealed semiconductor device 1 shown in FIGS. 1 to 4 by using the circuit member 30 manufactured as aforementioned will be described with reference to FIG. 18.

First, by performing the processes shown in FIG. 17, the circuit member 30 is prepared (FIG. 18A). Subsequently, after cleaning the circuit member 30, the silver plating layers 60 are formed on the terminal faces 31S of the inner terminals 31 (FIG. 18B). Additionally, instead of the silver plating layers 60, gold plating layers, palladium plating layers or the like may be formed.

Subsequently, the face on the side of the terminals 11 of the semiconductor element 10 is fixed via the insulating layers 20 onto the material face (semiconductor element mounted face) of the circuit member 30, and the semiconductor element 10 is mounted thereon. Subsequently, the terminals 11 of the mounted semiconductor element 10 and the silver plating layers 60 of the inner terminals 31 of the circuit member 30 are electrically connected with the wires 40 (FIG. 18C).

Subsequently, the circuit portions 30A, the semiconductor element 10 and the wires 40 are sealed with the sealing member 50 in such a manner that portions (terminal faces 32S) of the outer terminals 32 are exposed to the outside (FIG. 18D).

After sealing with the sealing member 50, a solder plating or another surface treatment agent is applied to the terminal faces 32S exposed to the outside of the outer terminals, then the outer electrodes 70 consisting of solder balls are formed (FIG. 18E).

Subsequently, the connection leads 34 of the circuit member 30 are cut to remove the outer frame member 36, thereby obtaining the resin-sealed semiconductor device 1 of the invention (FIG. 18F).

Additionally, the outer electrode of solder can be formed by applying a solder paste through screen printing, reflowing or the like, and it is sufficient only to obtain a necessary amount of solder for connecting the circuit board and the resin-sealed semiconductor device.

The method of manufacturing the circuit member of the invention will be described by using a case where the circuit member 130 shown in FIGS. 15 and 16 is manufactured.

FIG. 19 is a process diagram showing another embodiment of the method of manufacturing the circuit member according to the invention. Each process is shown in a cross section taken along a one-dot chain line VIII—VIII shown in FIG. 15.

First, a conductive board 180 with a thickness of about 100 to 250 $\mu$m formed of a 42 alloy (Fe alloy containing 41% of Ni) or the like is prepared as a material of the circuit member. After well cleaning the conductive board 180 by degreasing opposite faces 180S or otherwise (FIG. 19A), a photosensitive resist is applied to the opposite faces 180S and dried to form resist layers 182 (FIG. 19B). As the photosensitive resist, a known conventional resist can be used and, for example, a casein resist using a photosensitive material of potassium bichromate, a negative liquefied resist (PMER resist) manufactured by Tokyo Ouka Kogyo Kabushiki Kaisha or the like can be used.

Subsequently, after only predetermined sections of the resist layers 182 are exposed to light via predetermined pattern masks, developing is performed to form resist patterns 182A on one face of the conductive board 180 and resist patterns 182B on the other face (FIG. 19C). In a region on which the inner terminals, the leads and the connection leads are to be formed, one face of the conductive board 180 is not covered with the resist patterns 182A.

Subsequently, by using the resist patterns 182A and 182B as films resistant to etching agents, the conductive board 180 is etched with an etching liquid. The etching proceeds as shown in FIG. 19D, and is completed as shown in FIG. 19E. Since in the region with the inner terminals, the leads and the connection leads to be formed thereon one face of the conductive board 180 is not covered with the resist patterns 182A, the etching proceeds only from one side to perform a half etching. Through the half etching, thin-gage portions 183 are formed, and sections in which no resist pattern 182A or 182B is present are melted and removed.

For the etching liquid, an aqueous solution of ferric chloride is usually used to spray and etch the opposite faces of the conductive board 180. By adjusting an etching quantity in the half etching process, a thickness of each thin-gage portion 183 can be regulated.

Subsequently, by peeling and removing the resist patterns 182A and 182B, the inner terminals 131, the leads 133 and the connection leads 134 are formed thinner than the material of the conductive board 180, and the outer terminals 132 and the outer frame members 136 are formed as thick as the material of the conductive board 180, thereby obtaining the circuit member 130 (FIG. 19F). A portion between adjoining outer terminals 132 is separated because the etching proceeds from the opposite faces. The material face 180S of the conductive board 180 is left as one face (surface) of the inner terminal 131, the lead 133 or the connection lead 134. Opposite faces of the outer terminal 132 or the outer frame member 136 are formed by the material faces 180S of the conductive board 180.

Additionally, for reasons of productivity, when etching is performed, plural faces are processed as aforementioned.

A method of manufacturing the resin-sealed semiconductor device 101 shown in FIGS. 7 to 10 by using the circuit member 130 manufactured as aforementioned will be described with reference to FIG. 20.

First, by performing the processes shown in FIG. 19, the circuit member 130 is prepared (FIG. 20A). Subsequently, after cleaning the circuit member 130, the silver plating layers 160 are formed on the terminal faces 131S of the inner terminals 131 (FIG. 20B). Additionally, instead of the silver plating layers 160, gold plating layers, palladium plating layers or the like may be formed.

Subsequently, the face opposite to the side of the terminals 111 of the semiconductor element 110 is fixed via the insulating layer 120 onto the material face (semiconductor element mounted face) or the terminal faces 131S of the inner terminals 131 inside a region where the inner terminals 131 of the circuit member 130 are formed, and the semiconductor element 110 is mounted thereon. Subsequently, the terminals 111 of the mounted semiconductor element 110 and the silver plating layers 160 of the inner terminals 131 of the circuit member 130 are electrically connected with the wires 140 (FIG. 20C).

Subsequently, the circuit portions 130A, the semiconductor element 110 and the wires 140 are sealed with the sealing member 150 in such a manner that portions (terminal faces 132S) of the outer terminals 132 are exposed to the outside (FIG. 20D).

After sealing with the sealing member 150, a solder plating or another surface treatment agent is applied to the terminal faces 132S exposed to the outside of the outer terminals, then the outer electrodes 170 consisting of solder balls are formed (FIG. 20E).

Subsequently, the connection leads 134 of the circuit member 130 are cut to remove the outer frame member 136, thereby obtaining the resin-sealed semiconductor device 101 of the invention (FIG. 20F).

Additionally, the outer electrode of solder can be formed by applying a solder paste through screen printing, reflowing or the like, and it is sufficient only to obtain a necessary amount of solder for connecting the circuit board and the resin-sealed semiconductor device.

What is claimed is:

1. A method of manufacturing a circuit member for a resin-sealed semiconductor device, comprising:

forming a circuit member by half-etching a conductive board such that the circuit member includes an outer frame member and plural circuit portions extended from the outer frame member via connection leads independent of one another, each of the plural circuit portions being formed to include an outer terminal, a lead and an inner terminal in sequence to a tip end of each connection lead, surfaces of the circuit portions being made as semiconductor element mounted faces on which the inner terminals, the leads and the outer terminals form one plane, wherein the forming step forms the inner terminals, the connection leads and the leads of the plural circuit portions to be thinner than the conductive board, and forms the outer terminals to be substantially a same thickness as the conductive board.

2. The method of manufacturing the circuit member according to claim 1, further comprising:

coining a region flat including an inner terminal region on a back surface of the circuit member.

3. A method of manufacturing a circuit member for a resin-sealed semiconductor device, comprising:

forming a circuit member by half-etching a conductive board such that the circuit member includes an outer frame member and plural circuit portions extended from the outer frame member via connection leads independent of one another, each of the plural circuit portions being formed to include an inner terminal, a lead and an outer terminal in sequence to a tip end of each connection lead, surfaces of the circuit portions being made as semiconductor element mounted faces on which the inner terminals, the leads and the outer terminals form one plane, wherein the forming step forms the inner terminals, the connection leads and the leads of the plural circuit portions to be thinner than the conductive board, and forms the outer terminals to be substantially a same thickness as the conductive board.

4. The method of manufacturing the circuit member according to claim 3 wherein when each circuit portion is formed, a semiconductor mounting lead thinner than the outer terminal is integrally formed on the outer terminal in such a manner that a surface of the semiconductor mounting lead forms the same plane as said semiconductor element mounted face.

5. A method of manufacturing a resin-sealed semiconductor device, comprising:

forming a circuit member by half-etching a conductive board such that the circuit member includes plural circuit portions having inner and outer terminals integrally connected by leads and being arranged two-dimensionally along a plane and electrically independent of one another, said inner terminals and said leads being thinner than said outer terminals;

mounting a semiconductor element on top surfaces of said plural circuit portions with an insulating layer disposed therebetween;

electrically connecting top surfaces of said inner terminals to terminals of said semiconductor element with wires; and completely sealing said semiconductor device with a resin in such a manner that bottom surfaces of said outer terminals are partially exposed, wherein said device is configured as a chip size package (CSP) having a chip on lead (COL) structure, and wherein said outer terminals, said leads and a portion of said inner terminals of the circuit portions are directly underneath the semiconductor element with the insulating layer disposed therebetween.

6. The method of claim 5, further comprising:

providing outer electrodes including solder balls to said bottom surfaces of said outer terminals which are partially exposed.

7. The method of claim 6, wherein said device is configured as a ball grid array (BGA).

8. The method of claim 5, wherein said top surfaces of said inner terminals are flat.

9. The method of claim 5, further comprising:

providing a metallic layer between said top surfaces of said inner terminals and said wires electrically connected to said terminals of said semiconductor element.

10. The method of claim 9, wherein said metallic layer comprises a layer of one of silver plating, gold plating and palladium plating.

* * * * *